United States Patent [19]

Kajiyama

[11] Patent Number: 5,357,200
[45] Date of Patent: Oct. 18, 1994

[54] MAGNETIC RESONANCE IMAGING METHOD AND APPARATUS

[75] Inventor: Koji Kajiyama, Kamagaya, Japan

[73] Assignee: Hitachi Medical Corp., Tokyo, Japan

[21] Appl. No.: 67,624

[22] Filed: May 28, 1993

[30] Foreign Application Priority Data

May 29, 1992 [JP] Japan .................. 4-138540

[51] Int. Cl.⁵ ............................................. G01R 33/20
[52] U.S. Cl. ................................................... 324/309
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,684,891 | 8/1987 | Feinberg | 324/309 |
| 4,937,526 | 6/1990 | Ehman et al. | 324/309 |
| 4,952,876 | 8/1990 | Pelc | 324/309 |
| 5,202,632 | 4/1993 | Kaufman et al. | 324/309 |
| 5,239,266 | 8/1993 | Kaufman et al. | 324/309 |

Primary Examiner—Michael J. Tokar
Attorney, Agent, or Firm—Antonelli, Terry, Stout & Kraus

[57] ABSTRACT

An object is repeatedly excited by a 90-degree pulse and a plurality of spin echoes are obtained by a 180-degree pulse each time the excitation is repeated. The spin echoes are differently phase-encoded and the spin echoes thus generated are assigned to a substantial half portion of a raw image data space in a phase-encoding direction, the remaining substantial half of data being estimated from the data in that portion. The data covering the raw image data space are used to produce a corresponding image of the object.

10 Claims, 8 Drawing Sheets

MAGNETIC RESONANCE IMAGING METHOD AND APPARATUS

BACKGROUND OF THE INVENTION

1. Field of the Invention

The present invention relates generally to magnetic resonance imaging methods and apparatus, and more particularly to a resonance imaging method and apparatus fit for fast object-imaging.

2. Description of the Prior Art

Magnetic resonance imaging technology is applied to obtaining sectional images of objects by utilizing a nuclear magnetic resonance phenomenon and is well known as what is useful for examining the human body.

In order to increase throughput and to lighten the hardship imposed on patients while they are put under control for hours, there increasingly develops a demand for fast imaging methods in this field of technology.

The Magnetic Resonance in Medicine 3, 823–833 (1986) carries an article entitled "RARE Imaging: A Fast Imaging Method for Clinical MR" by J. Henning, A. Nauerth, and H. Friedburg. Under the Fast Imaging Method called RARE, a number of spin echo signals resulting from repeatedly applying a 180-degree radio frequency pulse after spins are excited with a 90-degree radio frequency pulse are differently phase-encoded, whereby one image is reconstructed. Typically, 128 or 256 spin echoes are employed to cause excitation once, that is, to reconstruct one image at one shot. Accordingly, the time required for imaging is reduced to 1/n (n: the number of echoes for use) in comparison with what is required in any ordinary spin echo method in which the excitation is needed 128 or 256 times to obtain 128 or 256 projections necessary for one image to be reconstructed. Since the number of spin echoes decreases in accordance with transverse relaxation time ($T_2$ relaxation time), however, the image obtained through this method tends to become significantly different in quality from what is obtained through the ordinary spin echo method.

The so-called multishot RARE method has been proposed to make the aforesaid problem less serious. This method is characterized in that the number of spin echoes is set not equal to the number of projections typical of the RARE method as noted previously but slightly smaller than the number of projections; namely, set at 4–16. Under this method, an image similar to what is obtainable through the ordinary spin echo method is obtained to the extent that the number of spin echoes is decreased on the one hand, while it is needed to repeat the excitation 16–64 times when n is 4–16 on the assumption that the number of projections is, for instance, 256 since the number of times the excitation is repeated is given by dividing the number of projections by the number of spin echoes on the other. Therefore, the imaging time is made longer to that extent in comparison with the typical RARE method stated above.

SUMMARY OF THE INVENTION

An object of the present invention is to provide a magnetic resonance imaging method for making possible fast imaging, and an apparatus for the same.

Another object of the present invention is to provide a magnetic resonance imaging method for making possible the acquisition of an image similar to what is acquirable through any ordinary spin echo method, and an apparatus for the same.

Still another object of the present invention is to provide a magnetic resonance imaging method for making possible not only fast imaging but also the acquisition of an image similar to what is acquirable through any ordinary spin echo method, and an apparatus for the same.

According to the present invention, an object is repeatedly excited so that a plurality of spin echoes may be generated each time the object is excited. The plurality of spin echoes are differently phase-encoded before being read out so that the plurality of spin echoes thus read out produce a first raw image data set covering a substantial half of a raw image data space in a phase-encoding direction thereof and are assigned to a plurality of corresponding regions in the substantial half partitioned in the phase-encoding direction, respectively. On the basis of the first raw image data set, a second raw image data set covering the remaining substantial half of the raw image data space in the phase-encoding direction thereof is estimated and on the basis of the first and second raw image data sets, an image of the object corresponding to the raw image data space is produced.

The raw image data covering a central portion of the raw image data space in the phase-encoding direction thereof may be used for phase correction when the second raw image data set is estimated. The substantial half of the raw image data space in the phase-encoding direction thereof may include or exclude that central portion and the word "substantial half" is used to that effect. Therefore, the word "substantial half" is not to be understood as the half in a strict sense.

These and other objects, features and advantages of the invention will become more apparent as the description proceeds, when considered with the accompanying drawings.

DESCRIPTION OF THE PREFERRED EMBODIMENT

Figure 1:
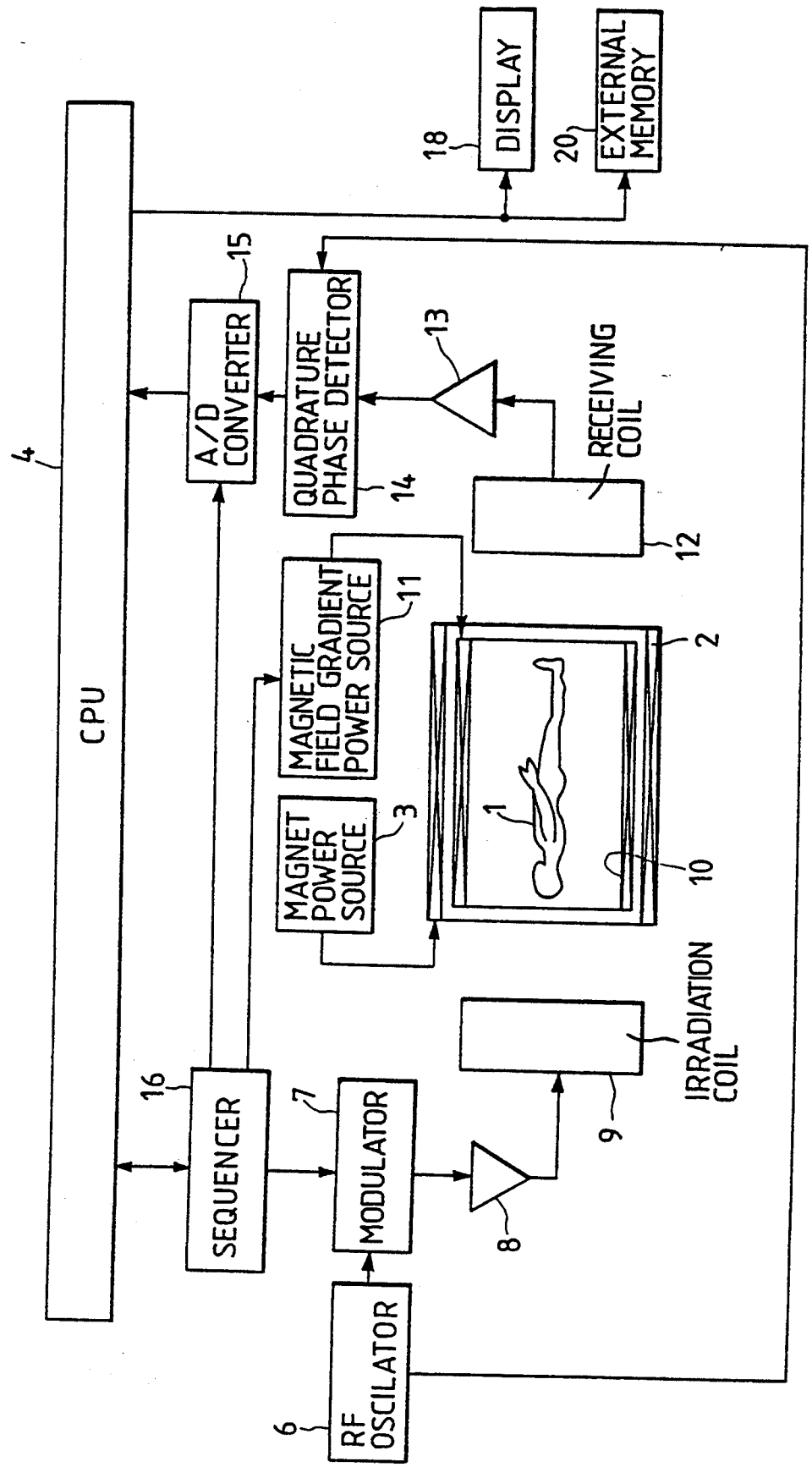
FIG. 1 is a block diagram of an embodiment of a magnetic resonance imaging apparatus according to the present invention.

Referring to FIG. 1, an object 1 to be examined is placed in a uniform static magnetic field produced by a magnet 2, which is driven by a magnet power source 3. Although the magnet 2 is shown to be of a superconductive or paraconductive type in FIG. 1, it may be a permanent magnet. A radio frequency from a radio frequency oscillator 6 is modulated by a modulator 7 so that it may be pulsed and what has thus been pulsed is amplified by an amplifier 8 before being applied by an irradiation coil 9 to the object 1, which is thereby subjected to nuclear magnetic resonance excitation. A magnetic field gradient coil 10 is driven by a magnetic field gradient power source 11 so as to give the static magnetic field magnetic field a gradient in the directions of X, Y and Z. A nuclear magnetic resonance signal from the object 1 is received by a receiving coil 12 and amplified by an amplifier 13. The amplified signal whose phase is detected by a quadrature phase detector 14 with the radio frequency from the radio frequency oscillator 6 as a reference signal is further digitized by an A/D converter 15 and introduced into a central processing unit 4.

A sequencer 16 is connected to the modulator 7, the magnetic field gradient power source 11 and the A/D converter 15, and controls the generation of the radio frequency pulse and the magnetic field gradient pulse in the directions of X, Y and Z simultaneously with the A/D conversion of the signal from the quadrature phase detector 14 under the control of the central processing unit 4.

The signal introduced into the central processing unit 4 goes through an image reconstructing process and an image of the object 1 which is obtained thereby is displayed on a display 18 and recorded in an external memory 20.

Figure 2:
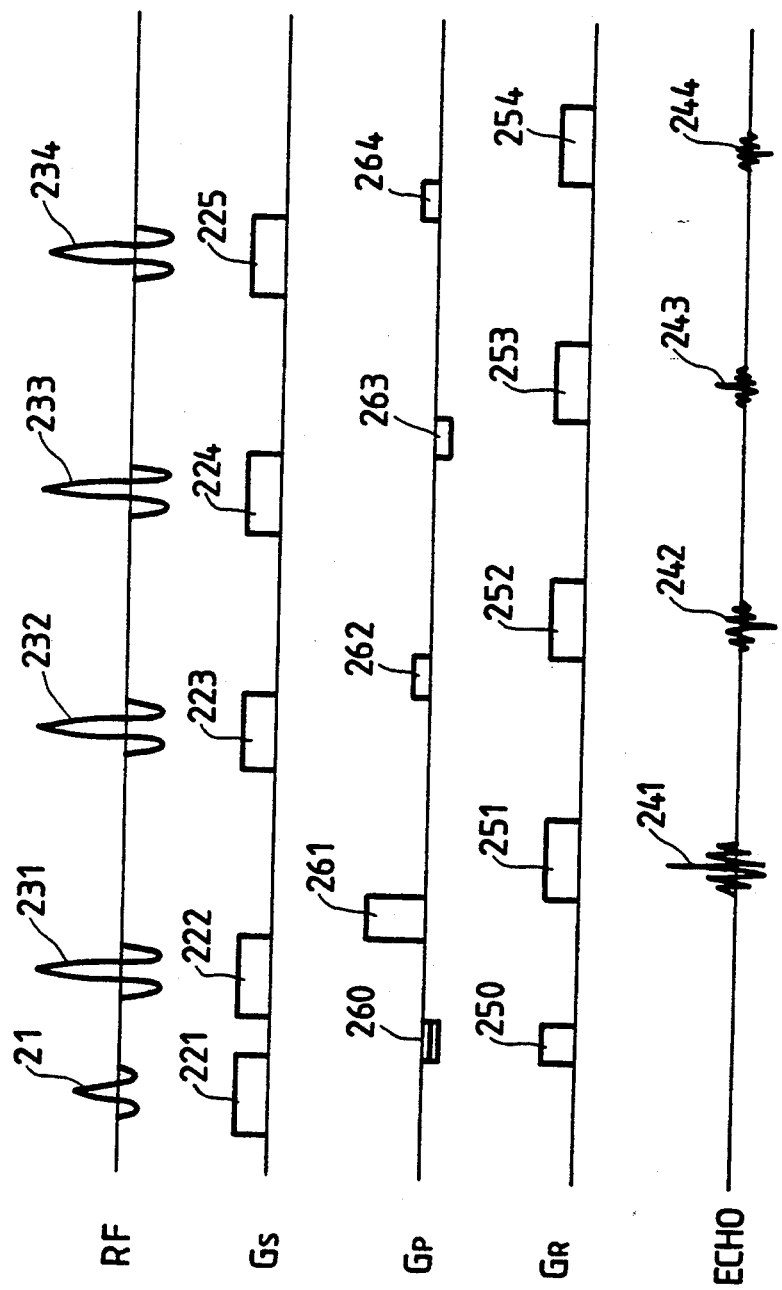
FIG. 2 is an exemplary pulse sequence diagram in the embodiment of FIG. 1.

Referring to FIG. 2, a selective 90-degree radio frequency pulse RF21 is applied in the presence of a magnetic field gradient pulse Gs221 for slice selection. Consequently, a slice perpendicular to the direction in which the magnetic field gradient pulse Gs221 for slice selection is applied is selectively excited. In other words, nuclear spins within the slice are tipped by 90 degrees in a rotating frame of reference. The nuclear spins that have been tipped are gradually dispersed.

Subsequently, a selective 180-degree radio frequency pulse RF231 is applied in the presence of a magnetic field gradient pulse Gs222 for slice selection. The nuclear spins that have tipped are inverted accordingly and the nuclear spins that have been dispersed are caused to converge gradually. As a result, a spin echo 241 as the nuclear magnetic resonance signal is produced from the whole slice. Given a time interval of $T_E/2$ between the 90-degree radio frequency pulse RF21 and the 180-degree radio frequency pulse RF231, the spin echo 241 emerges $T_E/2$ after the 180-degree radio frequency pulse RF231 is applied.

After the selective 180-degree radio frequency pulse RF231 is applied, selective 180-degree radio frequency pulses RF232–234 are applied at intervals of $T_E$ in the presence of magnetic field gradient pulses Gs223–225 for slice selection, respectively. Spin echoes 242–244 are thus generated $T_E/2$ after the respective 180-degree radio frequency pulses RF232–234 are applied. On noting the order in which the spin echoes 241–244 are generated, they are called the first, second, third and fourth spin echoes. The first to fourth spin echoes 241–244 are read out in the presence of magnetic field gradient pulses $G_R$251–254 for readout and sampled, respectively. The magnetic field gradient pulses $G_R$251–254 for readout are also known as magnetic field gradient pulses for frequency-encoding. A magnetic field gradient pulse $G_R$250 is applied so as to implement phase correction.

The pulse sequence in FIG. 2 is repeated and magnetic field gradient pulses $G_P$260–264 for phase-encoding are applied at this time to have the first to fourth spin echoes 241–244 differently phase-encoded. The spin echoes thus read out by the repetition of the sequence like this are assigned in the phase-encoding direction of a raw image data space (generally called a K-space). The way of assigning these spin echoes is determined by the number of echoes and the selection of the echo number which decides the image quality. The raw image data space includes a central portion for use as a DC or low frequency region and since the number of high frequency components increases as the distance from the central portion increases, it is preferred to assign a desired spin echo to the central portion. Further, the spin echoes should preferably be assigned so that discontinuity in signal intensity is minimized. If, for instance, the spin echoes are assigned in such a way as to give two adjacent spin echoes numbers different by one, such discontinuity in signal intensity will decrease.

Figure 3:
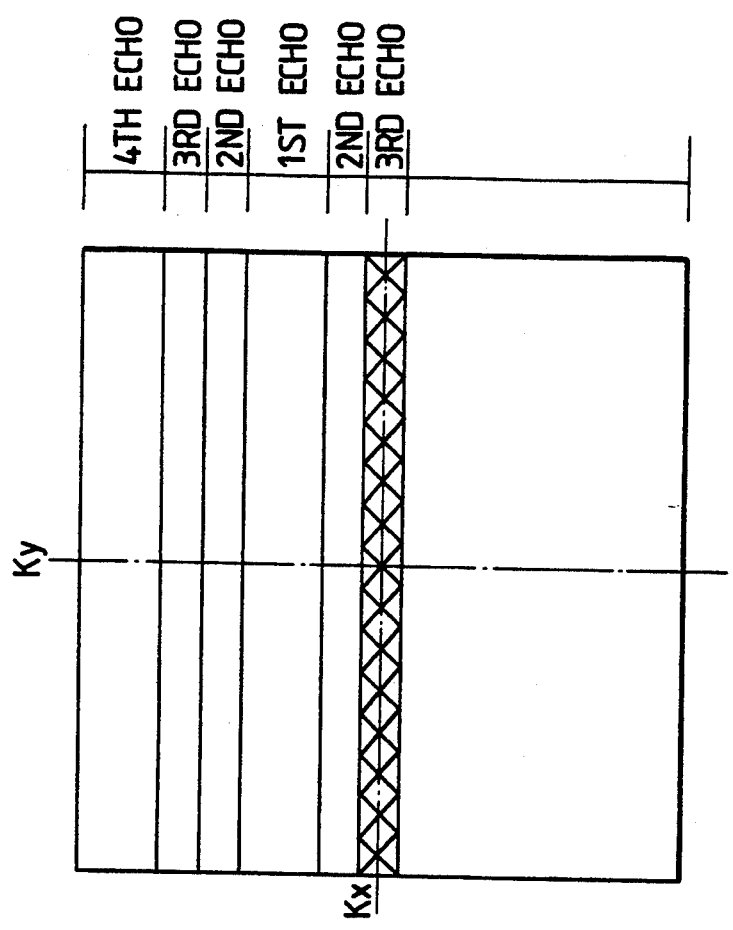
FIG. 3 is a diagram showing the arranging order of data covering a raw data space based on the present invention as a first example.

FIG. 3 shows an arrangement of data covering the raw image data space when the first to fourth spin echoes are used. In FIG. 3, the phase-encoding and frequency-encoding directions are indicated by the vertical axis ky and the horizontal axis kx, respectively. Data at individual echo numbers are substantially equal in number. First, the desired fourth spin echo is assigned to a region (DC or low frequency region) closest to the phase encoding center and the third spin echo data are stored in a region adjacent thereto. Further, the second and first spin echo data are stored in that order in regions having increasingly higher frequencies, whereby the first spin echo is assigned to the highest frequency region (the end region) in the direction of ky. The assignment of spin echoes may be made as shown in FIG. 4.

Figure 4:
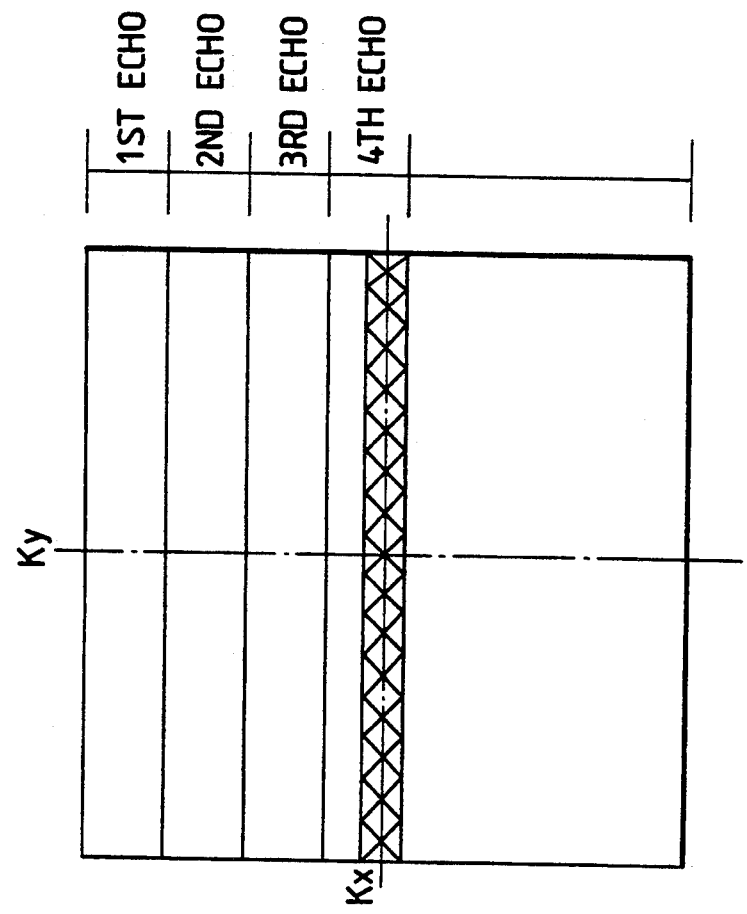
FIG. 4 is a diagram showing the arranging order of data covering a ran data space based on the present invention as a second example.

FIGS. 3 and 4 show cases where data covering substantial half of the raw image data space in the direction of ky are acquired by measurement. A description will further be given of the arrangement of raw image data covering the raw image data space as shown in FIGS. 3 and 4.

In FIGS. 3 and 4, discrete data are taken in the direction of ky and it has been arranged that the integrated value (i.e., phase-encoding quantity) of the phase (encoding magnetic field) gradient sensed by the spin until the echo is read out, that is, measured, is reduced to zero at the center in the direction of ky. It has also been arranged that the spin is caused to sense a gradient magnetic field in the phase direction so that the spin turns once at both ends of an imaging region (F.O.V.) at a place shifted by one from the center in the direction of ky. This process is given by $$2\pi = \gamma \sum_n (Gpn \cdot tn \cdot (F.O.V.))$$

where $\gamma$=gyro-magnetic ratio, Gpn=strength of the $n^{th}$ magnetic field gradient in the phase direction (however, the positive-to-negative relation is to be reversed once per 180-degree pulse to retain what is strong enough to have the spin sensed) tn=time required to apply the magnetic gradient at position No. n in the phase direction, n=the number of magnetic field gradient pulses applied in the phase direction until an echo signal having a target echo number is measured, and (F.O.V.)=length of one side in the direction of ky of the imaging region. With respect to the $m^{th}$ data from the center in the direction of ky, the strength of, and the time required to apply, the magnetic field gradient for phase-encoding are so determined as to establish $$2\pi m = \gamma \sum_n (Gpn \cdot tn \cdot (F.O.V.))$$

Then the so-called half scan technique is used to reproduce raw data on the image thus specifically picked up.

The principle of the so-called half scan technique will subsequently be described. The half scan technique is intended to shorten imaging time on the basis of the fact that the complex conjugate symmetry of raw data prior to Fourier transform and a phase error in a magnetic resonance imaging apparatus can be estimated from data on the low frequency side. In the imaging method by means of such a magnetic resonance imaging apparatus, an image is made available by subjecting a raw image data to two-dimensional Fourier transformation, or, conversely, a raw image data is obtained by subjecting an image to inverse Fourier transformation. In other words, on the assumption that only a real part exists in the image, an imaginary part is down to zero. With the raw image data subjected to inverse Fourier transform, the real part has an even function and the imaginary part an odd function.

Real $[\rho (kx, ky)]$ = Real $[\rho (-kx, -ky)]$

Imag $(\rho (kx, ky))$ = $-$Imag$[\rho(-kx, -ky)]$ where $\rho$ ( )=raw data (complex number), Real [ ]=real part, and Imag [ ]=imaginary part.

In the case of ideal raw image data, point symmetrical positional data with respect to the origin over the raw image data space have a complex conjugate relationship with each other.

However, various phase errors may exist in an actual apparatus and besides they have been known to exist in low frequency bands. Therefore, any phase error over an image space can be estimated by extracting raw image data in the low frequency band, that is, in the central portion by means of a low-pass filter, subjecting the raw image data thus extracted to two-dimensional Fourier transformation, and obtaining the phase of the vector quantity. This phase and the characteristics as previously noted may be utilized to form an image with a substantial half of raw image data.

Figure 5:
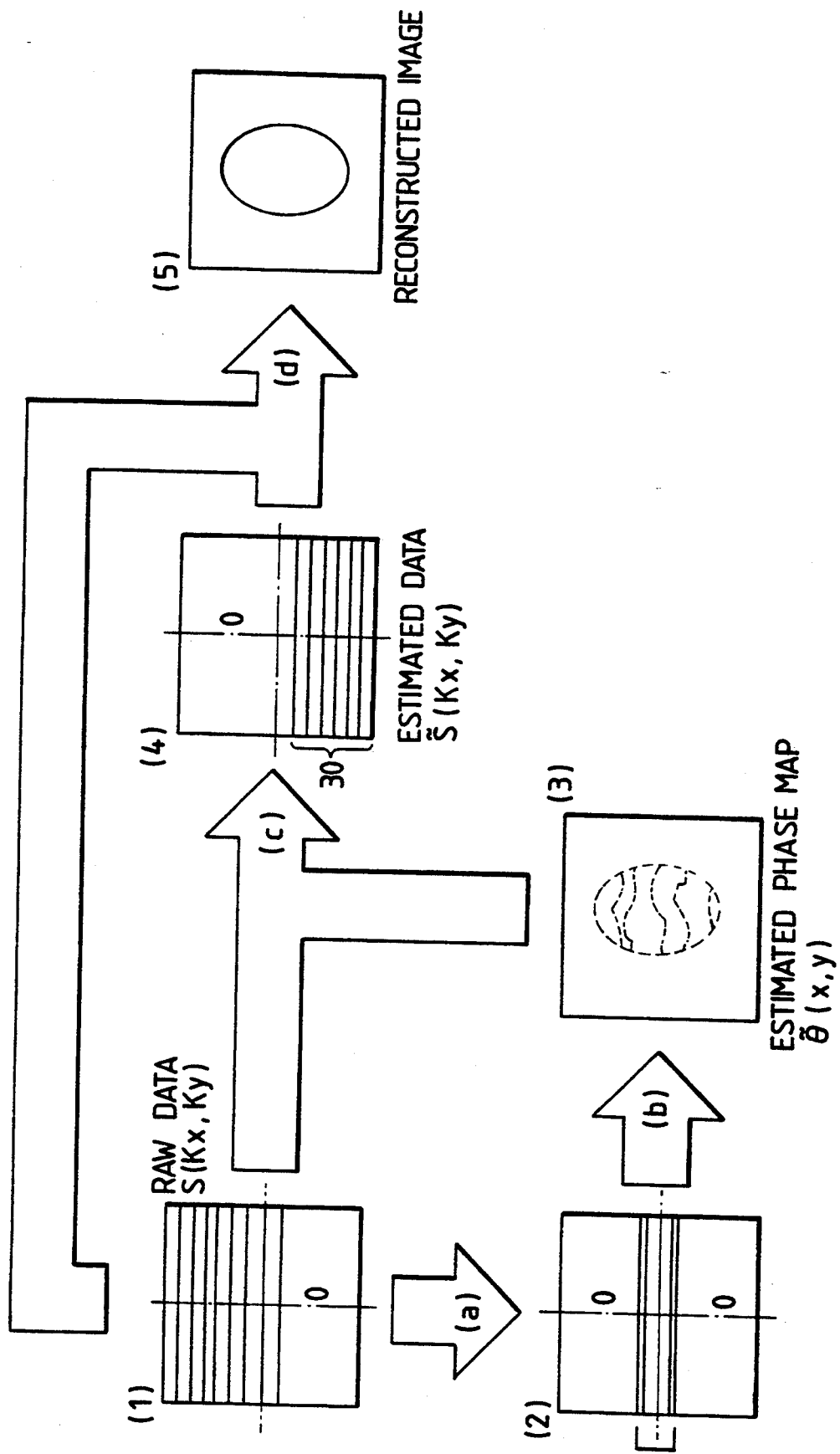
FIG. 5 is a diagram illustrating the principle of an exemplary half scan technique applicable to the present invention.

FIG. 5 schematically illustrates the aforesaid half scan technique. Numeral (1) in FIG. 5 denotes raw image data S (kx, ky). At step (a), the data are passed through a low-pass filter in the direction of ky so that the substantial central portion thereof is extracted (FIG. 5(2)).

The data cut off in the direction of ky is made available with respect to each of the same spin echo and this is because there arises at difference in phase between echoes. Although all data in the direction of kx are cut off, those in the direction of ky may also be passed through the low-pass filter so as to cat off the substantial central portion. At step (b), zero is substituted in the high frequency data space (the data space on the end side) of data other than those cut off as stated above and two-dimensional Fourier transformation is then applied thereto.

The raw image data is represented by a complex number (vector); its phase $\theta$ (x, y) is obtained (FIG. 5(3)) herein and what is obtained is called a phase map.

At step (c), zeroes are filled in the unmeasured portion of the raw image data S (kx, ky), which is subjected to two-dimensional Fourier transformation so as to form an image. This image is caused to turn reversely by the phase in the phase map $\theta$ (x, y) of (3). Subsequently, the image is subjected to two-dimensional inverse Fourier transform and only the unmeasured portion 30 is cut off (FIG. 5(4)) to provide an estimated data S (kx, ky) 23 of the unmeasured portion. At step (d), the measured data (FIG. 5(1)) and the estimated data (FIG. 5(4)) are combined over the k space and the combination is then subjected to two-dimensional Fourier transformation to reconstruct the image (FIG. 5(5)). In this case, the filter is normally used to smooth the Joint between the estimated and measured data when they are combined.

A detailed description has been given of the half scan technique itself in "MRI Image Reproducing Algorithm from Half the Number Measuring Data Using Phase Map," pp 182–187, Paper D, Vol. J71–D No. 1, January 1988, *Electronic Data Communication Society*.

Although a case of employing four echo signals has been explained by way of example in the embodiment shown, not only the number of spin echoes for use but also their arranging order is optional.

Figure 7:
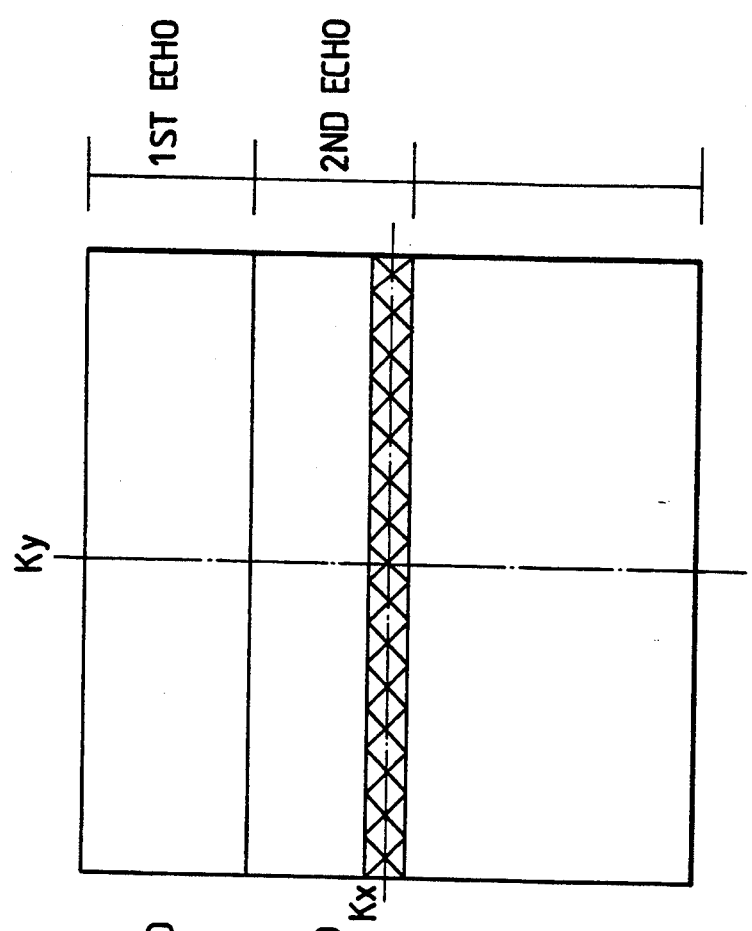
FIG. 7 is a diagram illustrating the arranging order of data covering a raw data space based on the present invention as a fourth example.
Figure 6:
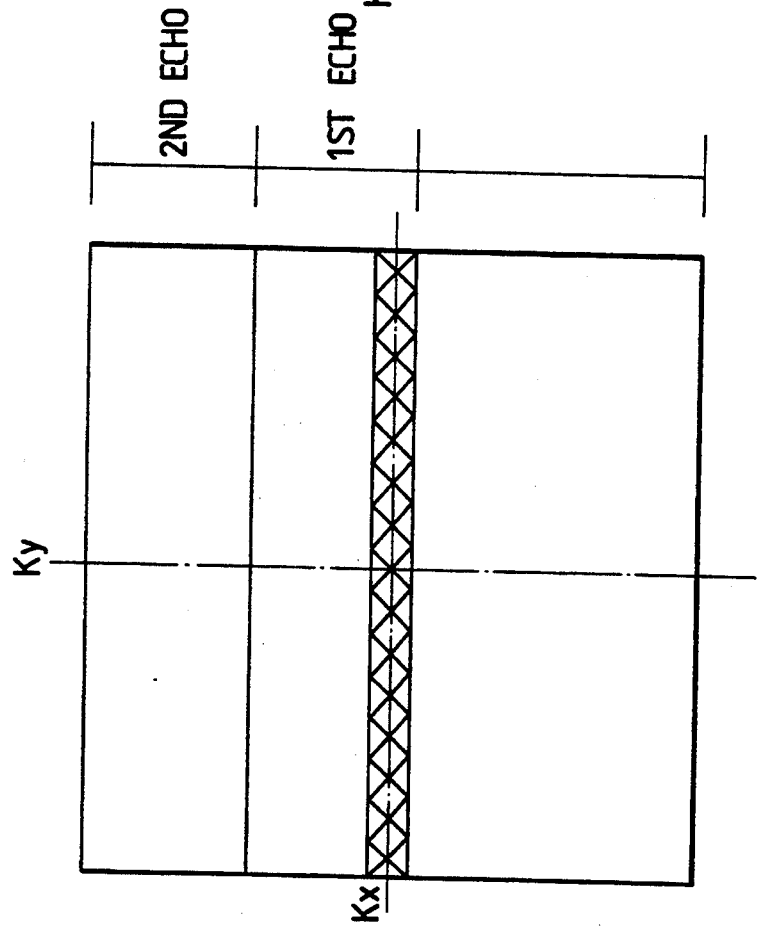
FIG. 6 is a diagram illustrating the arranging order of data covering a raw data space based on the present invention as a third example.

For example, FIG. 6 shows the order in which data are arranged in a case where two echo signals are used to obtain an image having the quality substantially determined by the first echo and FIG. 7 the order in which data are arranged in a case where two echo signals are used to obtain an image having the quality substantially determined by the second echo.

Figure 9:
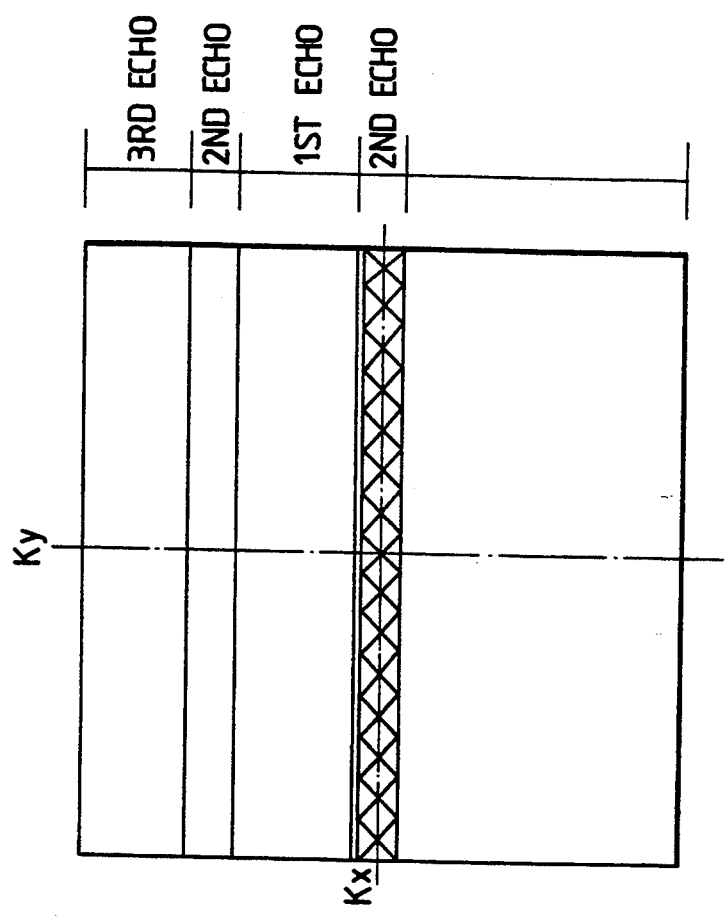
FIG. 9 is a diagram illustrating the arranging order of data covering a raw data space based on the present invention as a sixth example.
Figure 8:
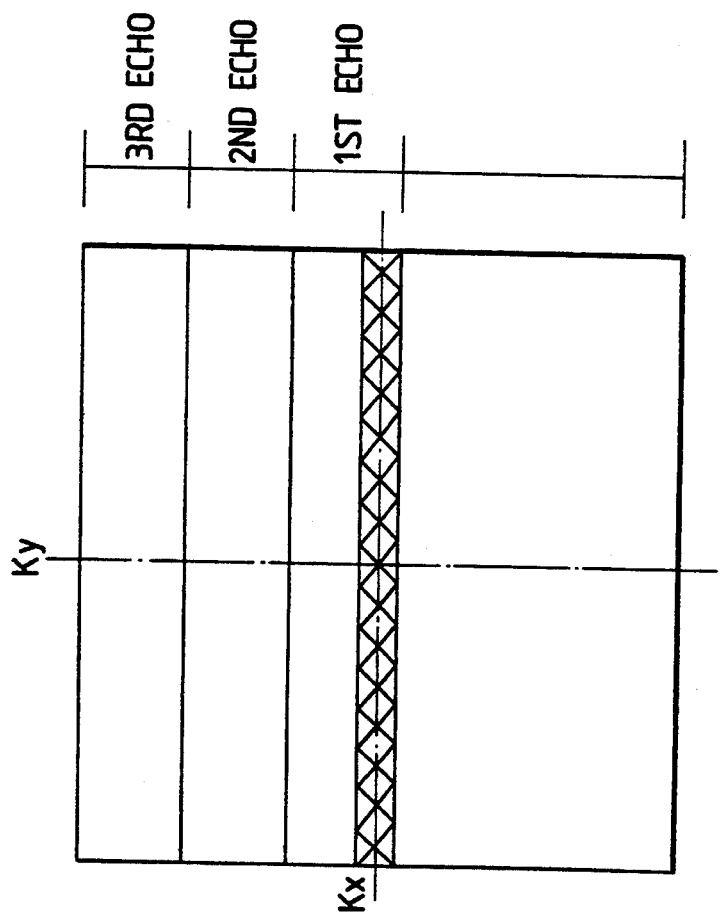
FIG. 8 is a diagram illustrating the arranging order of data covering a raw data space based on the present invention as a fifth example.
Figure 10:
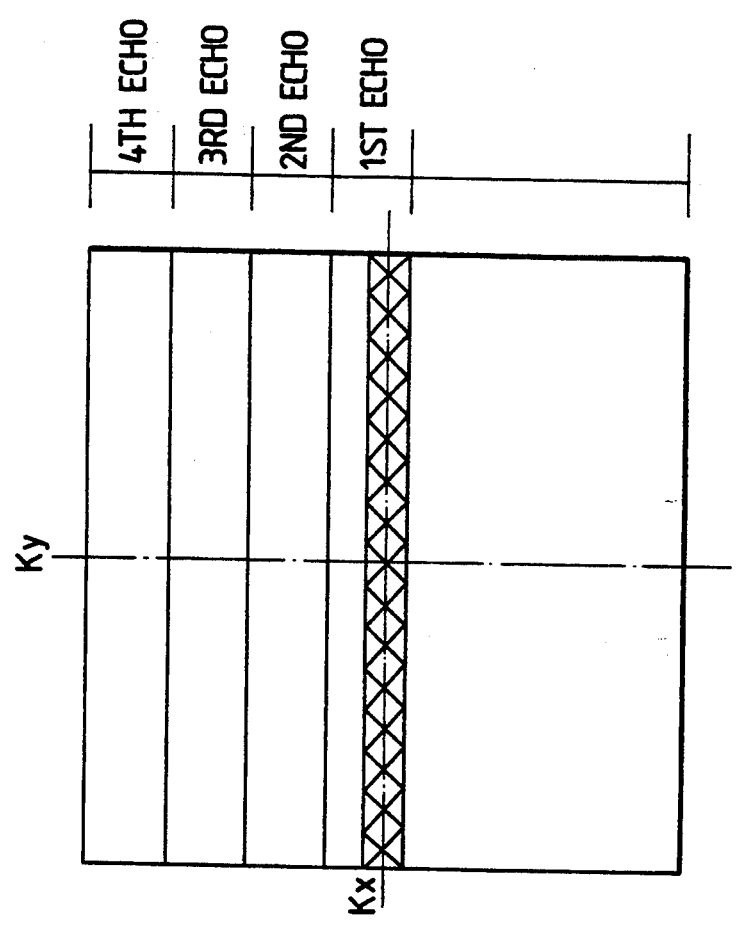
FIG. 10 is a diagram illustrating the arranging order of data covering a raw data space based on the present invention as a seventh example.

Moreover, FIG. 8 shows the order in which data are arranged in a case where three echo signals are used to obtain an image having the quality substantially determined by the first echo; FIG. 9 the order in which data are arranged in a case where three echo signals are used to obtain an image having the quality substantially determined by the second echo; and FIG. 10 the order in which data are arranged in a case where three echo signals are used to obtain an image having the quality substantially determined by the third echo.

Figure 11:
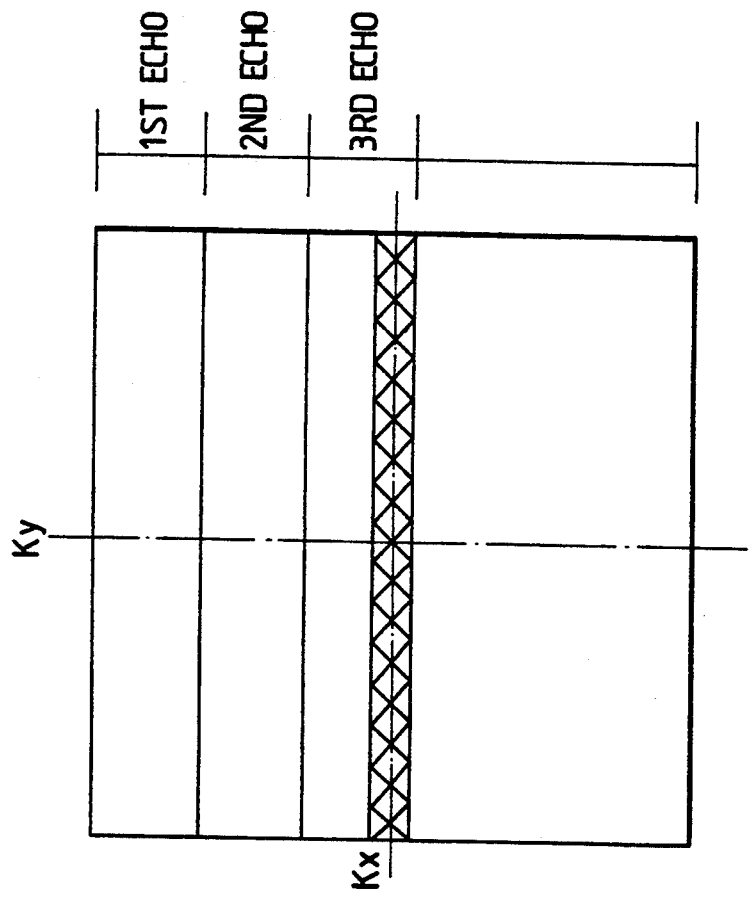
FIG. 11 is a diagram illustrating the arranging order of data covering a raw data space based on the present invention as an eighth example.
Figure 12:
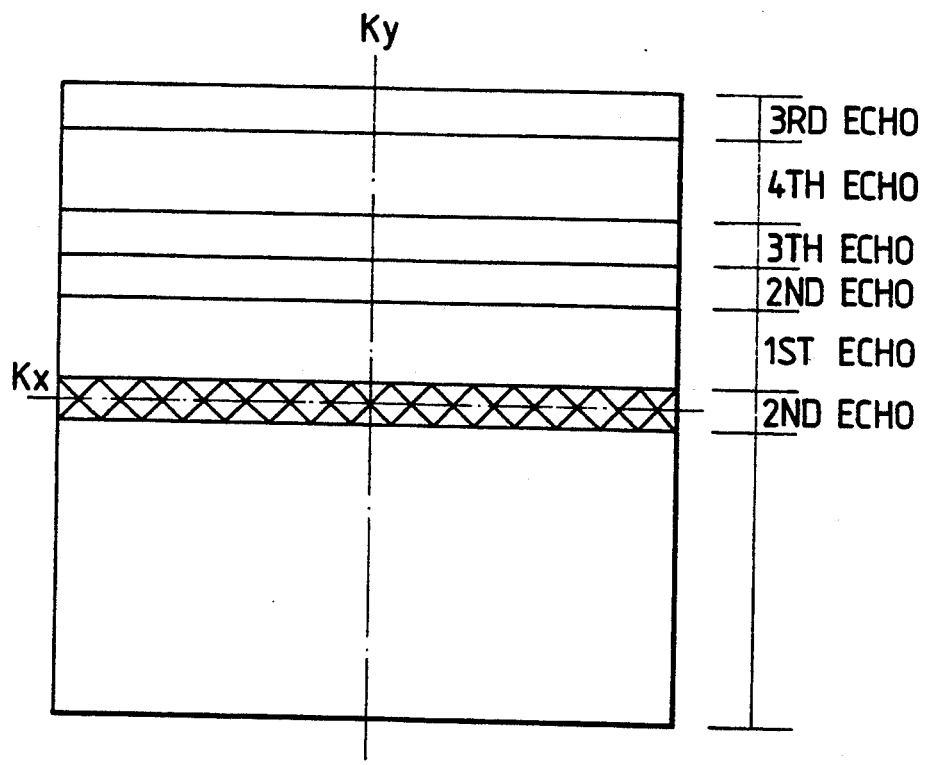
FIG. 12 is a diagram illustrating the arranging order of data covering a raw data space based on the present invention as a ninth example.
Figure 13:
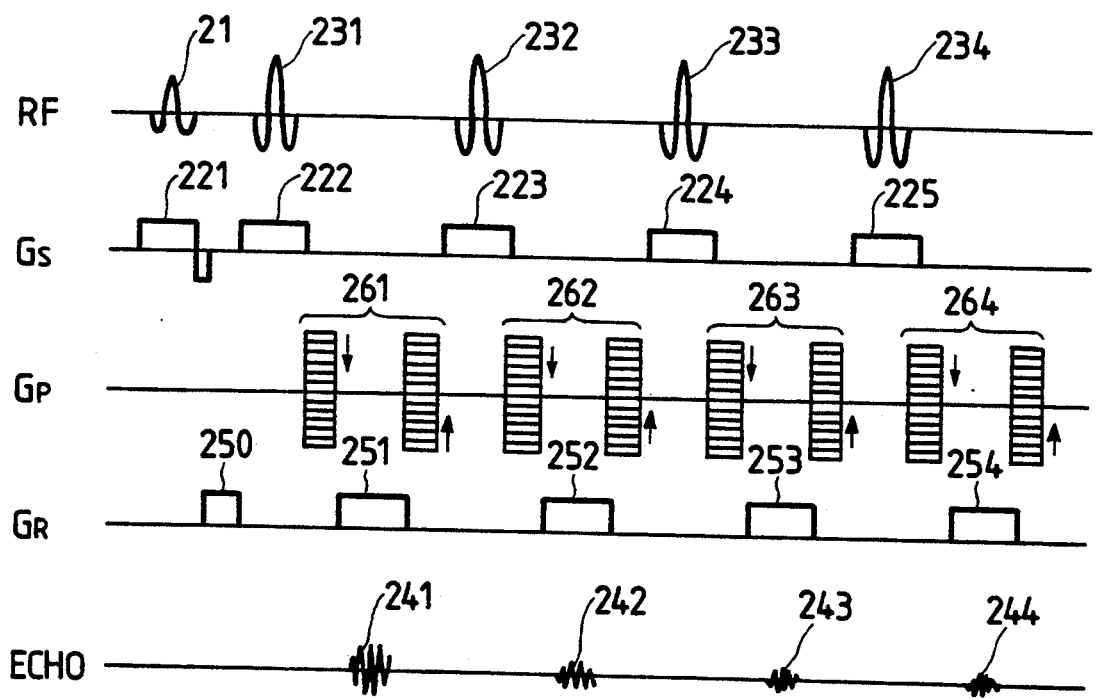
FIG. 13 is another exemplary pulse sequence diagram applicable to the present invention.

Further, FIG. 11 shows the order in which data are arranged in a case where four echo signals are used to obtain an image having the quality substantially determined by the first echo; FIG. 12 the order in which data are arranged in a case where four echo signals are used to obtain an image having the quality substantially determined by the second echo; FIG. 13 the order in which data are arranged in a case where four echo signals are used to obtain an image having the quality substantially determined by the third echo; and FIG. 14 the order in which data are arranged in a case where four echo signals are used to obtain an image having the quality substantially determined by the fourth echo.

The magnetic resonance imaging apparatus referred to in the embodiment shown is designed to acquire a substantial half of data over a K space using the rapid spin echo method of FIG. 2 and to subsequently fill the K space with all the data through the so-called half scan reconstructing technique.

Since it does not take so much time to implement the half scan reconstructing method in that case, the time required to fill up the data is nearly halved in comparison with the use of only the conventional rapid spin echo method. Therefore, measuring time can be shortened further.

Although only cases where the number of echoes for use ranges from 2 to 4 have been given with reference to the embodiment shown, it is needless to say feasible to employ more than four echoes with similar effects.

The present invention is applicable to those other than the rapid spin echo method of FIG. 2. FIG. 13 is a schematic diagram illustrating pulse sequence called a CPMG (Cart Purcell Meiboom Gill) method. Under this CPMG method, a 90-degree pulse is applied simultaneously with the application of a gradient magnetic field in the slice direction so as to selectively excite the spin. Then a 180-degree pulse which is 90-degree shifted in phase from the 90-degree pulse is applied predetermined time, for example, Te/2, after the diffusion of the spin, in order to generate a gradient magnetic field in the slice direction and an echo signal. The signal is read out in the direction of frequency by turning the spin by 180 degrees in phase on the excitation surface and subsequently encoding the phase. Subsequently as shown in FIG. 13, the echo signal is sequentially read out by applying the high frequency pulse and the gradient magnetic field. The present invention is also applicable to the CPMG method.

The measuring time can be shortened further as is obvious from the description given of the embodiment of the present invention.

What is claimed is:

1. A magnetic resonance imaging method, the combination comprising the steps of:
   (1) generating a static magnetic field in which an object is placed;
   (2) repeatedly exciting the object so as to generate a plurality of spin echoes each time the object is excited;
   (3) differently phase-encoding the plurality of spin echoes and reading out the plurality of spin echoes phase-encoded thus so that the plurality of spin echoes read out thus produce a first raw image data set covering a substantial half of a raw image data space in a phase-encoding direction thereof and are assigned to a plurality of corresponding regions in the substantial half partitioned in the phase-encoding direction, respectively;
   (4) estimating a second raw image data set covering the remaining substantial half of the raw image data space in the phase-encoding direction thereof on the basis of the first raw image data set; and
   (5) producing an image of the object corresponding to the raw image data space on the basis of the first and second raw image data sets.

2. A magnetic resonance imaging method, the combination comprising the steps of:
   (1) generating a static magnetic field in which an object is disposed;
   (2) repeatedly exciting the object so as to generate a plurality of spin echoes each time the object is excited;
   (3) differently phase-encoding the plurality of spin echoes and reading out the plurality of spin echoes phase-encoded thus so that the plurality of spin echoes read out thus produce a first raw data set covering a substantial half of a raw image data space in a phase-encoding direction thereof and are assigned to a plurality of corresponding regions in the substantial half partitioned in the phase-encoding direction, respectively and the discontinuity in intensity of the first raw data set is substantially minimum;
   (4) estimating a second raw data set covering the remaining substantial half of the raw image data space in the phase-encoding direction thereof on the basis of the first and second raw image data sets; and
   (5) producing an image of the object corresponding to the raw image data space on the basis of the first and second image data sets.

3. A magnetic resonance imaging method, the combination comprising the steps of:
   (1) generating a static magnetic field in which are object is disposed;
   (2) repeatedly exciting the object so as to generate a plurality of spin echoes each time the object is excited;
   (3) differently phase-encoding the plurality of spin echoes and reading out the plurality of spin echoes phase-encoded thus so that the plurality of spin echoes read out thus produce a first raw image data set covering that substantial half of a raw image data space in a phase-encoding direction thereof which includes a central portion of the raw image data space in the phase-encoding direction thereof and are assigned to a plurality of corresponding regions in the substantial half partitioned in the phase-encoding direction, respectively;
   (4) estimating a phase map of the data covering the central portion of the raw image data space;
   (5) estimating a second raw image data set covering the remaining substantial half of the raw image data space in the phase-encoding direction thereof on the basis of first raw image data set and the phase map; and
   (6) producing an image of the object corresponding to the raw image data space on the basis of the first and second raw image data sets.

4. A magnetic resonance imaging method, the combination comprising the steps of:
   (1) generating a static magnetic field in which an object is disposed;
   (2) repeatedly applying an excitation radio frequency pulse and a plurality of succeeding inversion radio frequency pulses to the object so as to repeatedly excite the object and to generate a plurality of spin echoes each time the object is excited;
   (3) differently phase-encoding the plurality of spin echoes in the presence of a plurality of phase-encoding magnetic field gradient pulses and reading out the plurality of spin echoes phase-encoded thus so that the plurality of spin echoes read out thus produce a first raw image data set covering that substantial half of a raw image data space in a phase-encoding direction thereof which includes a central portion of the raw image data space in the phase-encoding direction thereof and are assigned to a plurality of corresponding regions in the substantial half partitioned in the phase-encoding direction, respectively;

(4) estimating a phase map of the data covering the central portion of the raw image data space;

(5) estimating a second raw image data set covering the remaining substantial half of the raw image data space in the phase-encoding direction thereof on the basis of the first raw image data set and the phase map; and (6) producing an image of the object corresponding to the raw image data space on the basis of the first and second raw image data sets.

5. A magnetic resonance imaging method according to claim 4, wherein the excitation radio frequency pulse is a 90° radio frequency pulse and each of the plurality of inversion radio frequency pulses is a 180° radio frequency pulse.

6. A magnetic resonance imaging method according to claim 4, wherein each of the plurality of inversion radio frequency pulses is different in phase from the excitation radio frequency pulse.

7. A magnetic resonance imaging method according to claim 4, wherein the excitation radio frequency pulse is a 90° radio frequency pulse, and each of the plurality of inversion radio frequency pulses is a 180° radio frequency pulse different in phase from the 90° radio frequency pulse.

8. A magnetic resonance imaging apparatus, the combination comprising:

(1) means for generating a static magnetic field in which an object is disposed;

(2) means for repeatedly applying an excitation radio frequency pulse and a plurality of succeeding inversion radio frequency pulses to the object so as to repeatedly excite the object and to generate a plurality of spin echoes each time the object is excited;

(3) means for differently phase-encoding the plurality of spin echoes in the presence of a plurality of phase-encoding magnetic field gradient pulses and reading out the plurality of spin echoes phase-encoded thus so that the plurality of spin echoes readout thus produce a first raw image data set covering that substantial half of a raw image data space in a phase-encoding direction thereof which includes a central portion of the raw image data space in the phase-encoding direction thereof and are assigned to a plurality of corresponding regions in the substantial half partitioned in the phase-encoding direction, respectively; and (4) means for estimating a phase map of the data covering the central portion of the raw image data space, estimating a second raw image data set covering the remaining substantial half of the raw image data space in the phase-encoding direction thereof on the basis of the first raw image data set and the phase map, and producing an image of the object corresponding to the raw image data space on the basis of the first and second raw image data sets.

9. A magnetic resonance imaging apparatus according to claim 8, wherein the excitation radio frequency pulse is a 90° radio frequency pulse, and each of the plurality of inversion radio frequency pulses is a 180° radio frequency pulse.

10. A magnetic resonance imaging apparatus according to claim 9, wherein the 180° radio frequency pulse is different in phase from the 90° radio frequency pulse.

* * * * *